(12) United States Patent
Tseng et al.

(10) Patent No.: US 8,514,048 B2
(45) Date of Patent: Aug. 20, 2013

(54) TRANSFORMER CAPABLE OF ADJUSTING HEIGHT

(75) Inventors: Hsiang-Yi Tseng, Taoyuan Hsien (TW); Ching-Hsiang Tien, Taoyuan Hsien (TW); Yi-Lin Chen, Taoyuan Hsien (TW); Hsin-Wei Tsai, Taoyuan Hsien (TW); Chun-Song Ming, Hu Nan Province (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 6 days.

(21) Appl. No.: 13/286,234

(22) Filed: Nov. 1, 2011

(65) Prior Publication Data
US 2012/0169448 A1 Jul. 5, 2012

(30) Foreign Application Priority Data
Jan. 5, 2011 (CN) .......................... 2011 1 0021883

(51) Int. Cl.
H01F 27/30 (2006.01)
H01F 27/29 (2006.01)
H01F 27/24 (2006.01)

(52) U.S. Cl.
USPC ............ 336/198; 336/208; 336/192; 336/212

(58) Field of Classification Search
USPC .................. 336/192, 198, 208, 212, 221, 182
See application file for complete search history.

(56) References Cited

U.S. PATENT DOCUMENTS

| 2010/0156584 A1* | 6/2010 | Yamaguchi et al. ............ 336/65 |
| 2011/0084789 A1* | 4/2011 | Park et al. ........................ 336/65 |
| 2011/0115598 A1* | 5/2011 | Wu et al. ........................ 336/212 |

* cited by examiner

*Primary Examiner* — Elvin G Enad
*Assistant Examiner* — Mangtin Lian
(74) *Attorney, Agent, or Firm* — CKC & Partners Co., Ltd.

(57) ABSTRACT

A transformer capable of adjusting its height is provided. The transformer is formed on a circuit board having a receiving hole. The transformer comprises a winding module, two magnetic core modules, a plurality of pins and a plurality of supporting bulges. The winding module comprises a winding baseboard and a winding pillar where a winding structure is formed thereon. The winding pillar is received in the receiving hole. The winding baseboard further comprises a corresponding surface heading to the circuit board. The magnetic core modules contact and hold the winding module. The pins are formed on the edge of the to winding baseboard to be connected to the circuit board around the receiving hole. The supporting bulges are formed between the corresponding surface and the circuit board, wherein the height of the corresponding surface relative to the circuit board is adjusted according to the supporting bulges.

8 Claims, 5 Drawing Sheets

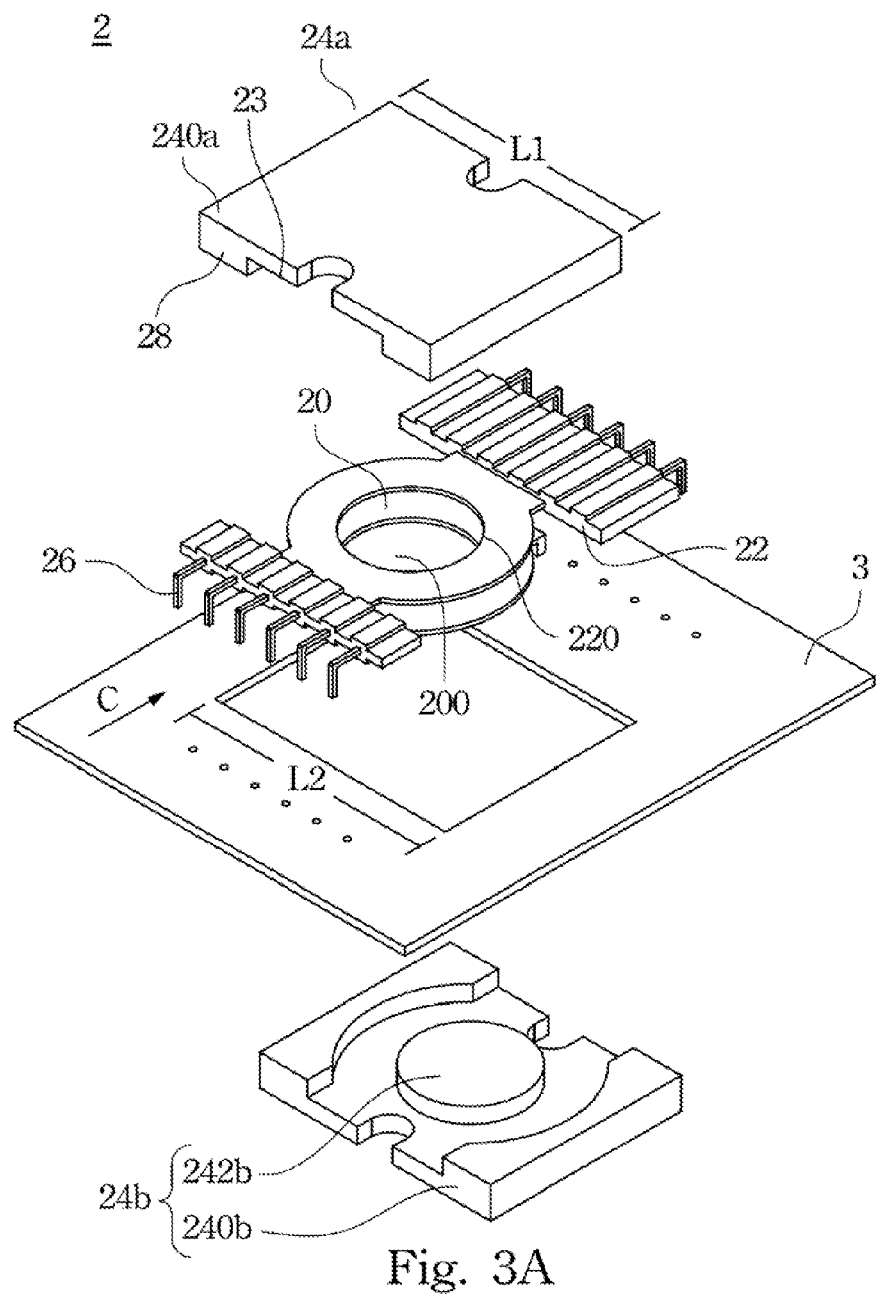
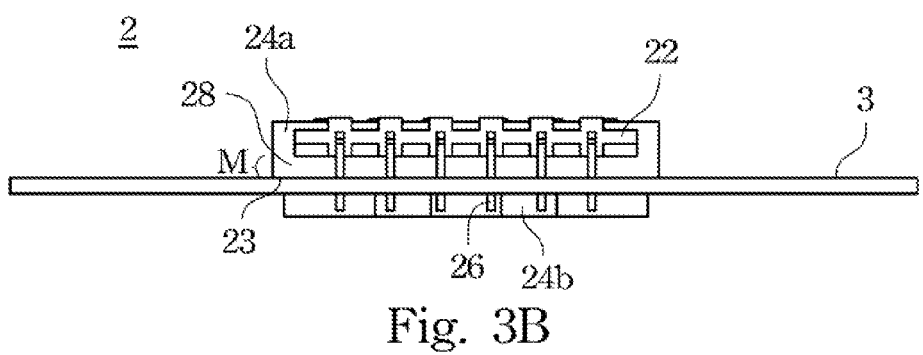
Fig. 3A
Fig. 3B

TRANSFORMER CAPABLE OF ADJUSTING HEIGHT

RELATED APPLICATIONS

This application claims priority to Chinese Application Serial Number 201110021883.0, filed Jan. 5, 2011, which is herein incorporated by reference.

BACKGROUND

1. Technical Field

The present invention relates to a magnetic element. More particularly, the present invention relates to a transformer capable of adjusting its height.

2. Description of Related Art Transformer is a common element in the electronic devices. Due to the shrinking size of the electronic devices, it is preferable to incorporate thinner transformer in the electronic devices such as the power supply of the LCD TV. Hence, in addition to the demand of high power efficiency, it is necessary to design transformers with lower height.

FIG. 1 is a 3-D diagram of a conventional transformer 1. The transformer 1 includes a winding module 10 and magnetic core 12a and 12b for holding the winding module 10, where the magnetic core 12a depicted in FIG. 1 has not combined with magnetic core 12b to hold the winding module 10 yet. In order to preserve some space for winding, the height of the winding module 10 can only decrease by forming a larger hole 140 on the circuit board 14 where the winding module 10 locates and by forming two bent parts on the pins of the winding module 10. Though the winding module 10 can be disposed in the hole 140 to lower its height, there is still at least a height of H. If the height of the magnetic core 12a is added, it is hard to dramatically decrease the total height of the winding module 10 and the magnetic core 12a. Besides, the hole 140 for incorporating the whole winding module 10 takes a large area of the circuit board 14, which is not economical. Furthermore, there is no adjusting and maintaining mechanisms that are easy for the user to modify the height between the transformer 1 and the circuit board 140 in the conventional design.

Accordingly, what is needed is a transformer capable of adjusting its height and capable of dramatically reducing its height without forming a larger hole on the circuit board. The present disclosure addresses such a need.

SUMMARY

An aspect of the present disclosure is to provide a transformer capable of adjusting its height. The transformer is formed on a circuit board having a receiving hole. The transformer comprises a winding module, two magnetic core modules, a plurality of pins and a plurality of supporting bulges. The winding module comprises a winding pillar and a winding baseboard. A winding structure is formed on the winding pillar, wherein the winding pillar is received in the receiving hole of the circuit board. The winding baseboard is connected to one end of the winding pillar and is parallel to the circuit board, wherein the winding baseboard comprises a corresponding surface facing to the circuit board. The two magnetic core modules contact and hold the winding module. The pins are formed on an edge of the winding baseboard to connect the winding baseboard and circuit board around the receiving hole, wherein the winding structure is further connected to the pins. The supporting bulges are formed between the corresponding surface and the circuit board, wherein the height of the corresponding surface relative to the circuit board is adjusted according to the supporting bulges.

According to an embodiment of the present disclosure, the winding baseboard comprises a plurality of embedding holes and each of the supporting bulges comprises an embedded structure such that the embedded structure is embedded in one of the embedding holes with an embedded depth to make the winding baseboard placed on the circuit board with the supporting bulges, the height of the corresponding surface relative to the circuit board is adjusted by tuning the embedded depth and a bulge height of the supporting bulges.

According to another embodiment of the present disclosure, one of the two magnetic core modules corresponds to the winding baseboard and the other corresponds to the winding pillar to contact and hold the winding structure. The winding pillar comprises a hollow central part connected to an opening of the winding baseboard and each of the two magnetic core modules comprises a base part and a central pillar part, wherein the base parts of the two magnetic core modules are adapted to each other such that the central pillar parts of the two magnetic core modules are placed in the hollow central part to make the two magnetic core modules contact and hold the winding structure.

According to yet another embodiment of the present disclosure, the winding structure comprises at least one winding portion. The two magnetic core modules are made of metallic and magnetic material. The circuit board further comprises a plurality of pinholes such that the pins are placed in the pinholes.

According to further another embodiment, the pins are mounted on the circuit board by riveting.

According to still another embodiment of the present disclosure, each of the pins comprises a bent part to separate each of the pins into a first portion connected to the winding baseboard and a second portion connected to the circuit board.

An aspect of the present disclosure is to provide a transformer capable of adjusting its height. The transformer is formed on a circuit board having a receiving hole. The transformer comprises a winding module, two magnetic core modules, a plurality of pins and a plurality of supporting bulges. The winding module comprises a winding pillar and a winding baseboard. A winding structure is formed on the winding pillar, wherein the winding pillar is received in the receiving hole of the circuit board. The winding baseboard is connected to one end of the winding pillar and parallel to the circuit board. The two magnetic core modules contact and hold the winding module, wherein one of the two magnetic core modules corresponds to the winding baseboard and the other corresponds to the winding pillar to contact and hold the winding structure, wherein the one corresponding to the winding baseboard further comprises a corresponding surface facing to the circuit board. The pins are formed on an edge of the winding baseboard to connect the winding baseboard and circuit board around the receiving hole, wherein the winding structure is further connected to the pins. The supporting bulges are formed between the corresponding surface and the circuit board, wherein the height of the corresponding surface relative to the circuit board is adjusted according to the supporting bulges.

According to an embodiment of the present disclosure, the corresponding surface comprises a plurality of embedding holes and each of the supporting bulges comprises an embedded structure such that the embedded structure is embedded in one of the embedding holes with an embedded depth to make the winding baseboard placed on the circuit board with the supporting bulges, the height of the corresponding surface relative to the circuit board is adjusted by tuning the embedded depth and a bulge height of the supporting bulges.

According to another embodiment of the present disclosure, the supporting bulges and the one of the two magnetic core modules having the corresponding surface are integrally formed. The supporting bulges makes the thickness of one of the two magnetic core modules corresponding to the winding baseboard larger than the one corresponding to the winding pillar. The winding pillar comprises a hollow central part connected to an opening of the winding baseboard and each of the two magnetic core modules comprises a base part and a central pillar part, wherein the base parts of the two magnetic core modules are adapted to each other such that the central pillar parts of the two magnetic core modules are placed in the hollow central part to make the two magnetic core modules contact and hold the winding structure.

According to still another embodiment of the present disclosure, the winding structure comprises at least one winding portion. The two magnetic core modules are made of metallic and magnetic material.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 3A is an exploded view of a transformer capable of adjusting its height in another embodiment of the present disclosure;

FIG. 3B is a side view of the combined transformer from the direction C depicted in FIG. 3A;

DETAILED DESCRIPTION

Figure 1:
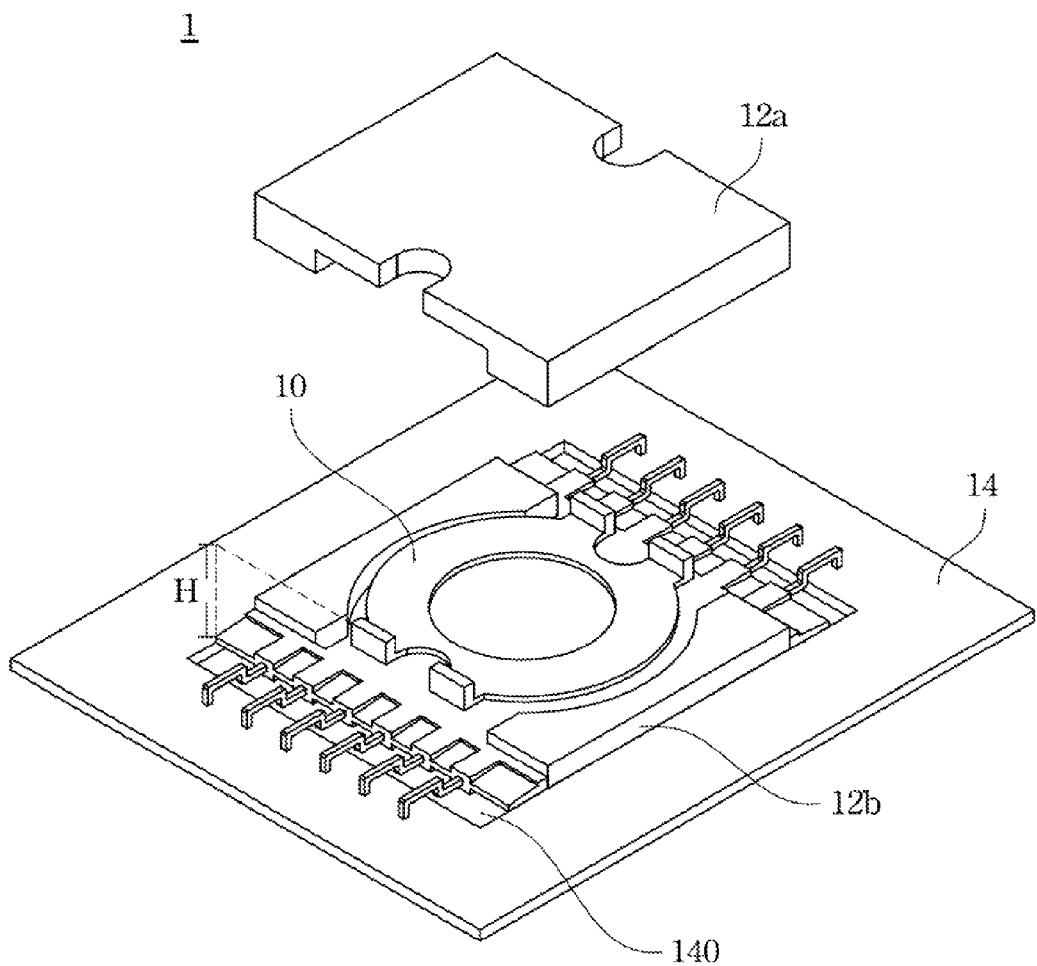
FIG. 1 is a 3-D diagram of a conventional transformer.

Reference will now be made in detail to the present embodiments of the invention, examples of which are illustrated in the accompanying drawings. Wherever possible, the same reference numbers are used in the drawings and the description to refer to the same or like parts.

Figure 2A:
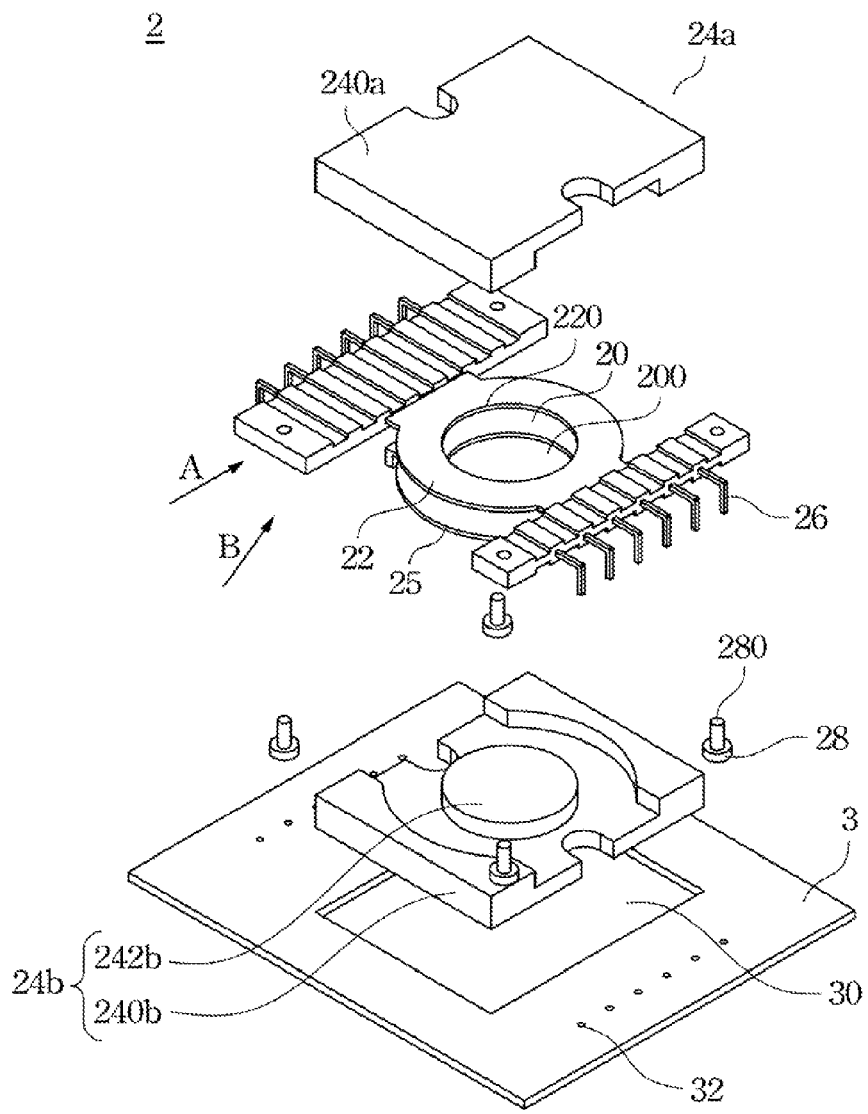
FIG. 2A is an exploded view of a transformer capable of adjusting its height in an embodiment of the present disclosure.
Figure 2B:
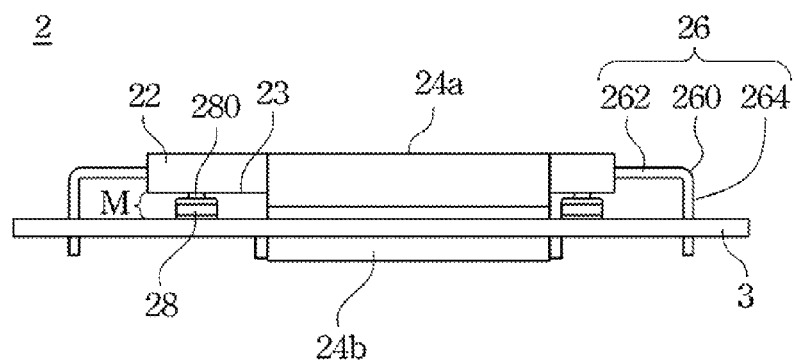
FIG. 2B is a side view of the combined transformer from the direction A depicted in FIG. 2A.

Please refer to FIG. 2A and FIG. 2B. FIG. 2A is an exploded view of a transformer 2 capable of adjusting its height in an embodiment of the present disclosure. FIG. 2B is a side view of the assembled transformer 2 from the direction of an arrow A depicted in FIG. 2A, wherein the transformer 2 is formed on the circuit board 3.

The transformer 2 is formed on the circuit board 3. The circuit board 3 comprises a receiving hole 30. The transformer 2 comprises a winding module, two magnetic core modules 24a and 24b, a plurality of pins 26 and a plurality of supporting bulges 28.

Figure 2C:
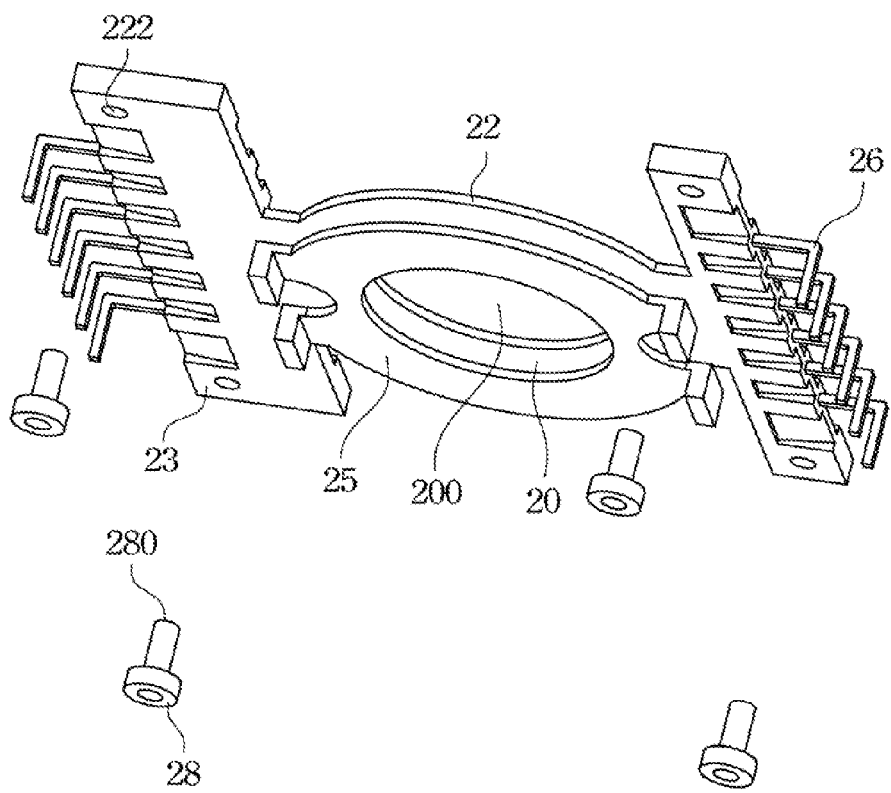
FIG. 2C is a 3-D view of the winding module and the supporting bulges along the B direction depicted in FIG. 2A.
Figure 2D:
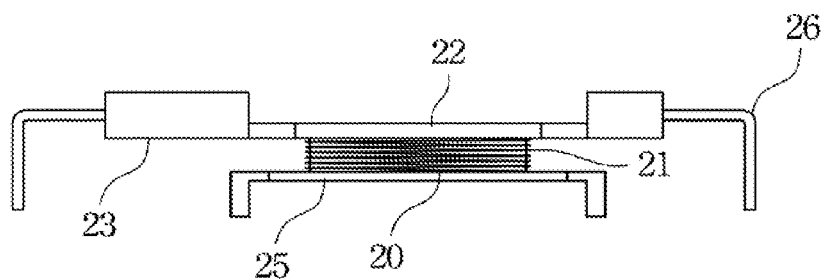
FIG. 2D is a side view of the winding module in FIG. 28.

Please refer to FIG. 2C and FIG. 2D at the same time. FIG. 2C is a 3-D view of the winding module and the supporting bulges 28 along the direction of an arrow B depicted in FIG. 2A. FIG. 2D is a side view of the winding module in FIG. 2B, wherein in FIG. 2D, only winding module is shown without showing the supporting bulges 28. The winding module comprises a winding pillar 20 for a winding structure 21 (shown in FIG. 2D only) formed thereon and a winding baseboard 22. In FIG. 2D, the winding structure 21 comprises one winding portion. However, in other embodiments, the winding structure 21 may comprise a plurality of winding portion depending on different applications. The winding pillar 20 is received in the receiving hole 30 of the circuit board 3 depicted in FIG. 2A. The winding baseboard 22 is connected to one end of the winding pillar 20 and is parallel to the circuit board 3, wherein the winding baseboard 22 comprises a corresponding surface 23 facing to the circuit board 3. In the present embodiment, the winding module further comprises a baffle board 25 formed on an end of the winding pillar 20 opposite to the winding baseboard 22 to baffle the winding structure 21 such that the winding structure 21 will not slide out of the winding pillar 20. In other embodiments, other baffling mechanisms can be adapted.

Please refer to FIG. 2A again. The two magnetic core modules 24a and 24b are made of metallic and magnetic material. The magnetic core module 24a contacts the winding baseboard 22 and the magnetic core module 24b contacts the winding pillar 20 such that the magnetic core modules 24a and 24b together hold the winding module.

In the present embodiment, the winding pillar 20 comprises a hollow central part 200 connected to an opening 220 of the winding baseboard 22. Each of the two magnetic core modules 24a and 24b comprises a base part 240a, 240b and a central pillar part 242b (the central pillar part of the magnetic core module 24a is not shown due to the direction of the view). The base parts 240a and 240b are adapted to each other such that the central pillar part 242a of the magnetic core module 24a and the central pillar part 242b of the magnetic core module 24b are placed in the hollow central part 200 to make the two magnetic core modules 24a and 24b contact and hold the winding structure 21.

The pins are formed on an edge of the winding baseboard 22 to connect the winding baseboard 22 and circuit board 3 around the receiving hole 30. The winding structure 21 formed on the winding pillar 20 described above is connected to the pins 26 and is further electrically connected to the elements on the circuit board 3 through the pins 26.

The supporting bulges 28 are formed between the corresponding surface 23 and the circuit board 3. In the present embodiment, the number of the supporting bulges 28 is four. In other embodiments, the number of the supporting bulges 28 can be varied and is not limited to the number disclosed above. In the present embodiment, the winding baseboard 22 comprises a plurality of embedding holes 222 and each of the supporting bulges 28 comprises an embedded structure 280 such that the embedded structure 280 is embedded in one of the embedding holes 222 with an embedded depth to make the winding baseboard 22 placed on the circuit board 3 with the supporting bulges 28, as shown in FIG. 2B. Accordingly, the height M of the corresponding surface 23 relative to the circuit board 3 is adjusted by tuning the embedded depth and the bulge height of the supporting bulges 28.

Hence, the height of the transformer 2 in the present embodiment can be greatly reduced because the winding pillar 20 of the transformer 2 can be disposed in the receiving hole 30 of the circuit board 3. The receiving hole 30 only receives the winding pillar 20 and the two magnetic core modules 24a and 24b. It does not need a large hole formed on the circuit board.

Further, as shown in FIG. 2B, the pins 26 do not need additional bent parts. Only one bent part 260 is needed such that each of the pins 26 is separated into a first portion 262 and a second portion 264. The first portion 262 is connected to the winding baseboard 22 and the second portion 264 is connected to the circuit board 3. In an embodiment, the circuit board 3 further comprises a plurality of pinholes 32 such that the second portions 264 of the pins 26 are placed in the pinholes 32 as shown in FIG. 2B. In another embodiment, the second portions 264 of the pins 26 are mounted on the circuit board 3 instead of placed in the pinholes 32. The height of the corresponding surface 23 relative to the circuit board 3 can be easily adjusted by tuning the embedded depth of the supporting bulges 28 embedded in the embedding holes 222 or by selecting the supporting bulges 28 with the appropriate bulge height.

Please refer to FIG. 3A and FIG. 3B. FIG. 3A is an exploded view of a transformer 2 capable of adjusting its height in another embodiment of the present disclosure. FIG. 3B is a side view of the combined transformer 2 from the direction C depicted in FIG. 3A.

Similar to the previous embodiment, the transformer 2 is formed on the circuit board 3. The circuit board 3 comprises a receiving hole 30. The transformer 2 comprises a winding module, two magnetic core modules 24a and 24b, a plurality of pins 26 and a plurality of supporting bulges 28. The winding module comprises a winding pillar 20 for a winding structure 21 (same as that shown in FIG. 2D) formed thereon and a winding baseboard 22. In the present embodiment, the structure of the winding pillar 20, the winding baseboard 22 and the pins 26 are about the same as those in the previous embodiment. Hence, no detail of these elements is further described here.

The two magnetic core modules 24a and 24b are made of metallic and magnetic material. The magnetic core module 24a contacts the winding baseboard 22 and the magnetic core module 24b contacts the winding pillar 20 such that the magnetic core modules 24a and 24b together hold the winding module.

The winding pillar 20 comprises a hollow central part 200 connected to an opening 220 of the winding baseboard 22. Each of the two magnetic core modules 24a and 24b comprises a base part 240a, 240b and a central pillar part 242b (the central pillar part of the magnetic core module 24a is not shown due to the direction of the view). The base parts 240a and 240b are adapted to each other such that the central pillar part of the magnetic core module 24a and the central pillar part 242b of the magnetic core module 24b are placed in the hollow central part 200 to make the two magnetic core modules 24a and 24b contact and hold the winding structure 21.

In the present embodiment, the magnetic core module 24a contacting the winding baseboard 22 comprises a corresponding surface 23 facing to the circuit board 3. The magnetic core module 24a can extend out of the area of the receiving hole 30. In other words, the magnetic core module 24a has a length L1 longer than the length L2 of the receiving hole 30 in a specific direction. The supporting bulges 28 are formed between the corresponding surface 23 and the circuit board 3. In the present embodiment, the supporting bulges 28 and the base part 240a of the magnetic core module 24a are integrally formed. In the present embodiment, the supporting bulges 28 make the thickness of the magnetic core module 24a larger than that of the magnetic core module 24b.

Consequently, the height of the transformer 2 in the present embodiment can be greatly reduced because the winding pillar 20 of the transformer 2 can be disposed in the receiving hole 30 of the circuit board 3. The height M of the corresponding surface 23 relative to the circuit board 3 can be easily adjusted by selecting the supporting bulges 28 with the appropriate bulge height.

Figure 4A:
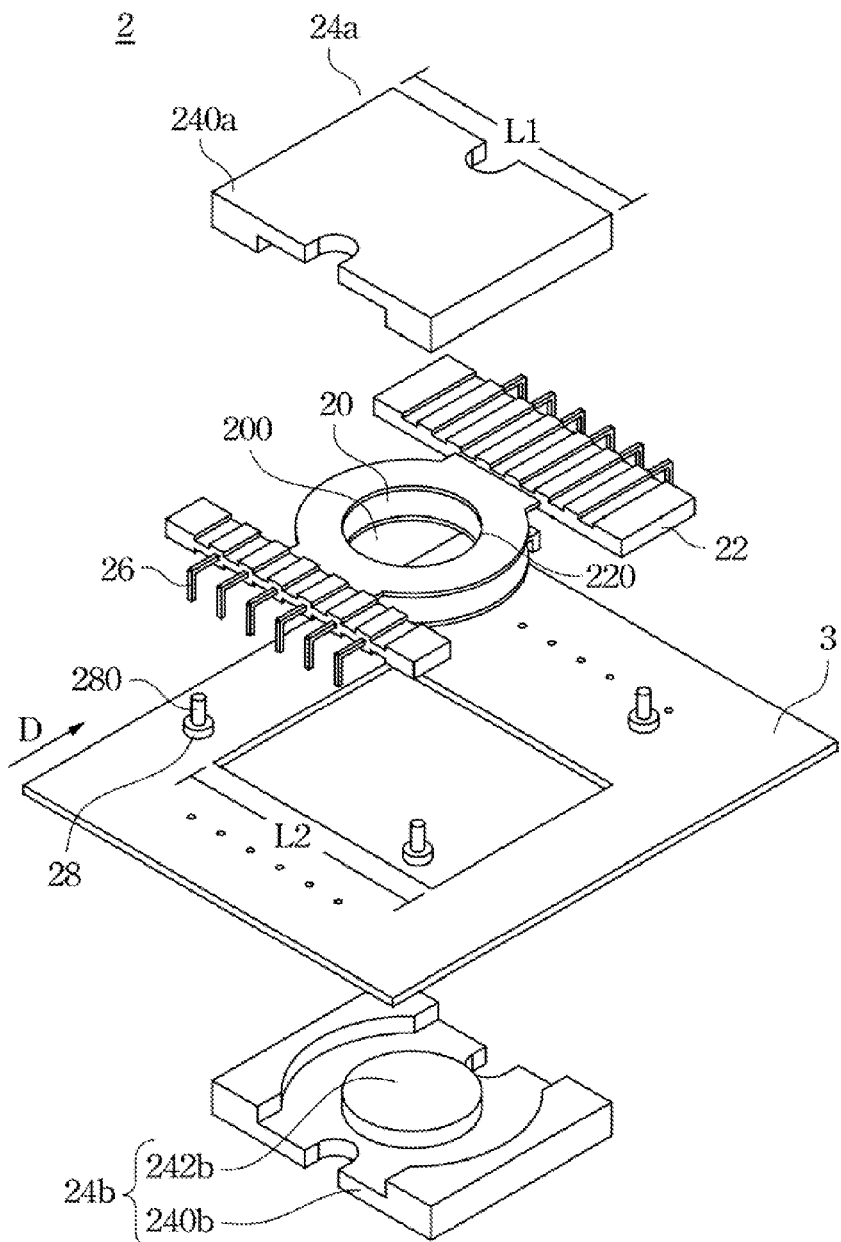
FIG. 4A is an exploded view of a transformer capable of adjusting its height in yet another embodiment of the present disclosure.
Figure 4B:
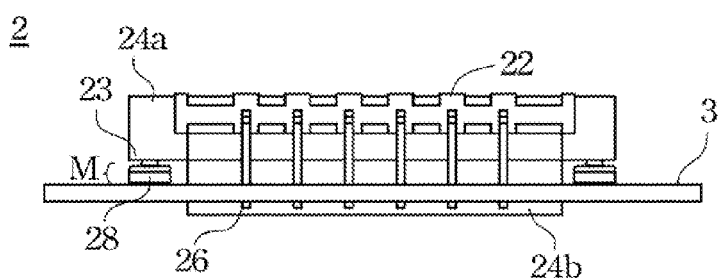
FIG. 4B is a side view of the combined transformer from the direction D depicted in FIG. 4A.

Please refer to FIG. 4A and FIG. 4B. FIG. 4A is an exploded view of a transformer 2 capable of adjusting its height in yet another embodiment of the present disclosure. FIG. 4B is a side view of the assembled transformer 2 from the direction D depicted in FIG. 4A, wherein the transformer 2 is formed on the circuit board 3.

Similar to the previous embodiment, the transformer 2 is formed on the circuit board 3. The circuit board 3 comprises a receiving hole 30. The transformer 2 comprises a winding module, two magnetic core modules 24a and 24b, a plurality of pins 26 and a plurality of supporting bulges 28. The winding module comprises a winding pillar 20 for a winding structure 21 (same as that shown in FIG. 2D) formed thereon and a winding baseboard 22. In the present embodiment, the structure of the winding pillar 20, the winding baseboard 22 and the pins 26 are about the same as those in the previous embodiment. Hence, no detail of these elements is further described here.

The two magnetic core modules 24a and 24b are made of metallic and magnetic material. The magnetic core module 24a contacts the winding baseboard 22 and the magnetic core module 24b contacts the winding pillar 20 such that the magnetic core modules 24a and 24b together hold the winding module 21.

The winding pillar 20 comprises a hollow central part 200 connected to an opening 220 of the winding baseboard 22. Each of the two magnetic core modules 24a and 24b comprises a base part 240a, 240b and a central pillar part 242b (the central pillar part of the magnetic core module 24a is not shown due to the direction of the view). The base parts 240a and 240b are adapted to each other such that the central pillar part 242a of the magnetic core module 24a and the central pillar part 242b of the magnetic core module 24b are placed in the hollow central part 200 to make the two magnetic core modules 24a and 24b contact and hold the winding structure.

In the present embodiment, the magnetic core module 24a contacting the winding baseboard 22 comprises a corresponding surface 23 facing to the circuit board 3. The magnetic core module 24a can extend out of the area of the receiving hole 30. In other words, the magnetic core module 24a has a length L1 longer than the length L2 of the receiving hole 30 in a specific direction. The supporting bulges 28 are formed between the corresponding surface 23 and the circuit board 3. In the present embodiment, a plurality of embedding holes 222 similar to those shown in FIG. 2C (not shown in FIG. 4A and FIG. 4B) are formed on the corresponding surface 23 of the magnetic core module 24a. Each of the supporting bulges 28 comprises an embedded structure 280 such that the embedded structure 280 is embedded in one of the embedding holes 222 with an embedded depth to make the winding baseboard 22 placed on the circuit board 3 with the supporting bulges 28, as shown in FIG. 4B. Accordingly, the height M of the corresponding surface 23 relative to the circuit board 3 is adjusted by tuning the embedded depth and the bulge height of the supporting bulges 28.

Therefore, the height of the transformer 2 in the present embodiment can be greatly reduced because the winding pillar 20 of the transformer 2 can be disposed in the receiving hole 30 of the circuit board 3. The height of the corresponding surface 23 relative to the circuit board 3 can be easily adjusted by tuning the embedded depth of the supporting bulges 28 embedded in the embedding holes 222 or by selecting the supporting bulges 28 with the appropriate bulge height.

The height of the transformer of the present disclosure can be greatly reduced because the winding pillar of the transformer can be disposed in a smaller receiving hole of the circuit board. Further, the height of the transformer can be easily adjusted with the use of the supporting bulges.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A transformer having an adjustable height formed on a circuit board having a receiving hole, comprising:
    a winding module comprising:
        a winding pillar where a winding structure is formed thereon, wherein the winding pillar is received in the receiving hole of the circuit board; and
        a winding baseboard connected to one end of the winding pillar and parallel to the circuit board, wherein the winding baseboard comprises;
        a corresponding surface facing to the circuit board; and
        a plurality of embedding holes;
    two magnetic core modules contacting and holding the winding module;
    a plurality of pins formed on an edge of the winding baseboard to connect the winding baseboard and circuit board around the receiving hole, wherein the winding structure is further connected to the pins; and
    a plurality of supporting bulges formed between the corresponding surface and the circuit board, wherein each of the supporting bulges comprises an embedded structure such that the embedded structure is embedded in one of the embedded holes with an embedded depth to make the winding baseboard placed on the circuit board with the supporting bulges, the height of the corresponding surface relative to the circuit board is adjusted by turning the embedded depth and a bulge height of the supporting bulges.

2. The transformer of claim 1, wherein one of the two magnetic core modules is corresponding to the winding baseboard and the other is corresponding to the winding pillar to contact and hold the winding structure.

3. The transformer of claim 2, wherein the winding pillar comprises hollow central part connected to an opening of the winding baseboard and each of the two magnetic core modules comprises a base part and a central pillar part, wherein the base parts of the two magnetic core modules are adapted to each other such that h central pillar parts of the two magnetic core modules are placed in the hollow central part to make the two magnetic core modules contact and hold the winding structure.

4. The transformer of claim 1, wherein the winding stucture comprises at least one winding portion.

5. The transformer of claim 1, wherein the two magnetic core modules are made of metallic and magnetic material.

6. The transformer of claim 1, wherein the circuit board further comprises a plurality of pinholes such that the pins are placed in the pinholes.

7. The transformer of claim 1, wherein the pins are mounted on the circuit board.

8. The transformer of claim 1, wherein each of the pins comprises a bent part to separate each of the pins into a first portion connected to the winding baseboard and a second portion connected to the circuit board.

* * * * *